July 22, 1969 R. J. RANSIL ET AL 3,457,541

MOUNTING BOARD FOR ELECTRONIC CIRCUIT ELEMENTS

Filed May 1, 1967

INVENTORS.
RAYMOND J. RANSIL
MARKO I. LIPANOVICH
CHARLES H. ALFORD
BY
George Sullivan
Agent United States Patent Office 3,457,541

Patented July 22, 1969

3,457,541

MOUNTING BOARD FOR ELECTRONIC CIRCUIT ELEMENTS

Raymond J. Ransil, Saratoga, Marko I. Lipanovich, Los Altos, and Charles H. Alford, Santa Clara, Calif., assignors to Lockheed Aircraft Corporation, Burbank, Calif.

Filed May 1, 1967, Ser. No. 635,078
Int. Cl. H05k *1/02;* H02b *9/00*
U.S. Cl. 339—17 6 Claims

ABSTRACT OF THE DISCLOSURE

A mounting board adapted to receive an electronic circuit element of the type having a plurality of lead wires extending therefrom. The mounting board comprises a centrally apertured planar wafer of insulating material having a plurality of electrical contact pins positioned thereon. An inner wall which defines the aperture is provided with a plurality of indentations which are spaced from the contact pins.

Many schemes have been devised to facilitate the construction (packaging) of high frequency electronic circuits composed of minute circuit elements and discrete components. The general requirements that all manufacturers of electronics subsystems and systems are concerned are accessibility, workability, noise reduction, flexibility and producibility.

Heretofore, mounting boards for electronic circuit elements were generally made of a sheet of insulation material having a plurality of holes provided therein for receiving electrical leads from the electronic elements and components. The leads from the electronic elements and components were soldered or welded in position. Interconnection was provided by the use of the standard printed circuit techniques. The mounting boards with the plurality holes provided therein required an assembly technique in which the plurality of circuit leads were simultaneously threaded through the plurality of holes in the mounting board. In cases where the circuit element had a multiplicity of leads (5 or more), the assembly procedure became a very tedious and time consuming procedure.

Using this background information, it is the object of the present invention to provide a basic electronic module made from an improved mounting board upon which electronic elements and discrete components may be mounted with relative ease of assembly.

Another object of the invention is to provide non-interferring construction of the modules to permit quick and easy access to any terminal of any module.

Another object of the invention is to provide low wiring density modules which are easily inserted into and removed from subassemblies.

Another object of the present invention is to provide modules having low impedance power distribution, point to point wiring, and low cabling cross talk to insure the lowest possible noise level.

Another object of the present invention is to provide modules which will accommodate conventional thin film or integrated circuits.

Another object of the present invention is to provide a circuit module which is compatible with automatic interconnect techniques and provide standard interchangeable parts at each assembly level.

These and other objects of the present invention will become readily apparent after a careful perusal of the following specification and drawings, of which:

Figure 1:
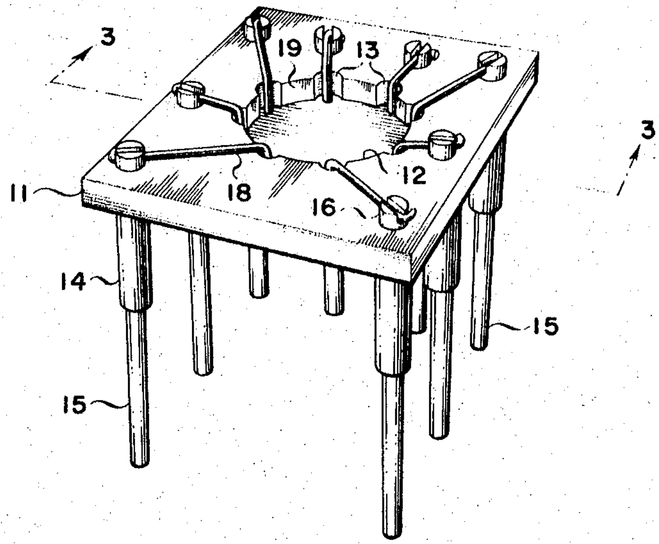
FIGURE 1 is a prospective view of the improved circuit board shown with an integrated circuit mounted thereon.
Figure 3:
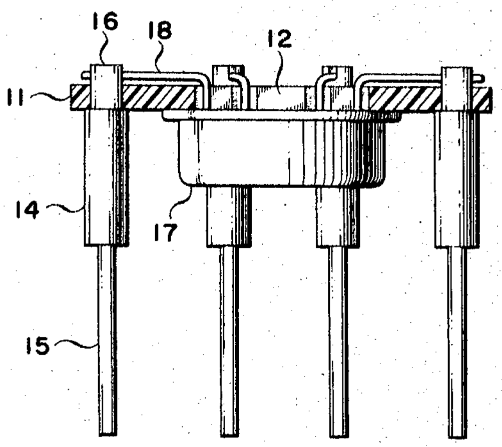
FIGURE 3 is a cross section view of FIGURE 1 taken at the line 3—3 in the direction of the arrows.
Figure 2:
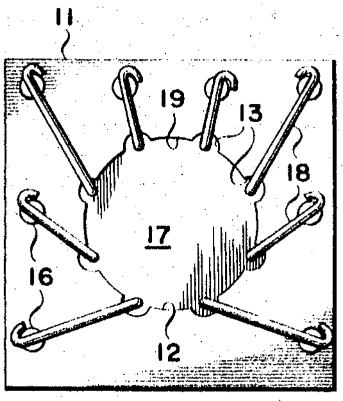
FIGURE 2 is the bottom view of the circuit board showing the wire leads connected to the connector pins of the circuit board.

Referring now to FIGURES 1 through 3, a mounting board or wafer 11, made from a single piece of semi-ridged, non-conducting material such as epoxy is shown. A substantially circular aperture 12 is provided in wafer 11 at substantially the center thereof. Aperture 12 is defined by an inner wall 19. A plurality of semi-circular perforations or indentations 13 are provided around the inner edge of wall 19. Both aperture 12 and indentations 13 may be provided in wafer 11 by means of a convenient punch tool or other desired means. The exact size of aperture 12 and the size spacing and number of indentations 13 may be varied to conform to the needs of the particular electronic element to be mounted. The outer edge of wafer 11 is shown having a plurality of connector pins 14 mounted therein to provide interconnect means for wafer 11.

An electronic circuit element 17 is shown mounted on one side of wafer 11. This electronic circuit element (not part of the present invention) is of the integrated circuit type, or may be any other discrete component, for which the novel wafer of the present invention is made to accommodate. Electronic circuit element 17 is of the type having a plurality of lead wires 18 extending from the bottom portion thereof. Lead wires 18 of the electronic circuit element 17 are conveniently inserted through the aperture 12, and lead wires 18 are conveniently positioned in one of the indentations 13. The lead wire is then bent over at a substantially 90° angle and electrically fastened to the terminal board end 16 of a designated contact pin 14. The means by which lead wires 18 are secured to the terminal ends 16 of contact pins 14 is one of choice. However, the soldering method is preferred, although welding, brazing, or wire-wrap may be used if so desired.

Once the electronic circuit 17 is correctly positioned on a wafer 11 and lead wires 18 are connected to the terminal ends 16 of contact pins 14, a basic electronic module has been produced which will provide the user a small, single function elemental packaging unit from which various types of electronic components and electronic sub-systems may be built. It is envisioned that plurality of the modules will be mounted in large wiring matrices which is provided with a plurality of plug in receiving means upon which inter-connect ends 15 of contact pins 14 may be positioned. A plurality of wiring matrices are mounted in racks and the modules are interconnected to form operational equipment. In actual practice, basic modules were made about 0.75 inch square, each having a single integrated circuit mounted in a 10 lead transistor-type can. 10 contact pins were provided, one for each lead.

What is claimed is:

1. A mounting board adapted to receive an electronic circuit element of the type having a plurality of lead wires extending therefrom, the invention comprising; a planar wafer of an insulating material having a plurality of electrical contact pins positioned thereon; said planar wafer provided with an aperture in the center portion thereof; said planar wafer including an inner wall spatially separated from said contact pins which defines said aperture, said inner wall provided with a plurality of indentations whereby an electronic circuit element of the type having a plurality of lead wires extending therefrom may be mounted on said planar wafer, the lead wires of said electronic circuit element extend through the aperture and each of the lead wires from the electronic circuit element is positioned within a selected indentation and is electrically connected to a selected electrical contact pin.

2. The mounting board according to claim 1 wherein each of said electrical contact pins is positioned near the outer edge of said planar wafer.

3. The mounting board according to claim 1 wherein said inner wall is electrically insulated from said electrical contact pins.

4. The mounting board according to claim 1 wherein each of said electrical contact pins project from said planar wafer.

5. The mounting board according to claim 4 wherein each of said electrical contact pins are positioned substantially normal to said planar wafer.

6. The mounting board according to claim 4 wherein each of said electrical contact pins pass through said planar wafer.

References Cited

UNITED STATES PATENTS

| | | |
|---|---|---|
| 2,524,939 | 10/1950 | Stephan et al. |
| 3,184,532 | 5/1965 | Spera. |

DARRELL L. CLAY, Primary Examiner

U.S. Cl. X.R.

174—68.5; 317—101; 336—65, 192